United States Patent
Iijima et al.

(10) Patent No.: US 6,787,462 B2
(45) Date of Patent: Sep. 7, 2004

(54) METHOD OF MANUFACTURING SEMICONDUCTOR DEVICE HAVING BURIED METAL WIRING

(75) Inventors: Tadashi Iijima, Yokohama (JP); Tadayoshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 10/107,040

(22) Filed: Mar. 28, 2002

(65) Prior Publication Data

US 2002/0142622 A1 Oct. 3, 2002

(30) Foreign Application Priority Data

Mar. 28, 2001 (JP) ........................................ 2001-092535
Sep. 28, 2001 (JP) ........................................ 2001-303411

(51) Int. Cl.[7] ............................................. H01L 21/44
(52) U.S. Cl. ..................... 438/680; 438/768; 438/786; 438/902
(58) Field of Search ................................ 438/768, 786, 438/791, 958, 902, 680

(56) References Cited

U.S. PATENT DOCUMENTS

| | | | | |
|---|---|---|---|---|
| 6,107,192 A | * | 8/2000 | Subrahmanyan et al. | ... 438/637 |
| 6,120,639 A | * | 9/2000 | Redline et al. | ............. 156/325 |
| 6,147,002 A | * | 11/2000 | Kneer | ......................... 438/692 |
| 6,153,523 A | * | 11/2000 | Van Ngo et al. | ............ 438/687 |
| 6,172,421 B1 | * | 1/2001 | Besser et al. | ................ 257/751 |
| 6,248,665 B1 | | 6/2001 | Bao et al. | |
| 2002/0113271 A1 | * | 8/2002 | Noguchi et al. | ............ 257/369 |

FOREIGN PATENT DOCUMENTS

| | | |
|---|---|---|
| JP | 11-087353 | 3/1999 |
| JP | 2001-053076 | 2/2001 |

OTHER PUBLICATIONS

T. Takewaki et al., "A Novel Self–Aligned Surface–Silicide Passivation Technology for Reliability Enhancement in Copper Internconnects", Symposium on VLSI Technology Digest of Technical Papers, pp. 31–32, (1995).

H. Yamaguchi et al., "A 7 Level Metallization With Cu Damascene Process Using Newly Developed Abrasive Free Polishing", IEEE, pp. 264–266, (200).

Hiroshi Ikegami et al., U.S. Pending application Ser. No. 09/946,601, filed Sep. 6, 2001.

* cited by examiner

*Primary Examiner*—Renzo Rocchegiani
(74) *Attorney, Agent, or Firm*—Finnegan, Henderson, Farabow, Garrett & Dunner, L.L.P.

(57) ABSTRACT

A metal wiring buried in an insulating layer is subjected to a reducing treatment prior to formation of a second insulating layer on the insulating layer under the condition that the total partial pressure of oxygen and water vapor is sufficiently low.

17 Claims, 6 Drawing Sheets

METHOD OF MANUFACTURING SEMICONDUCTOR DEVICE HAVING BURIED METAL WIRING

CROSS-REFERENCE TO RELATED APPLICATIONS

This application is based upon and claims the benefit of priority from the prior Japanese Patent Applications No. 2001-092535, filed Mar. 28, 2001; and No. 2001-303411, filed Sep. 28, 2001, the entire contents of both of which are incorporated herein by reference.

BACKGROUND OF THE INVENTION

1. Field of the Invention

The present invention relates to a method of manufacturing a semiconductor device having buried metal wirings or interconnections, and more particularly, to a method of manufacturing a semiconductor device having buried metal wirings or interconnections with clean surfaces.

2. Description of the Related Art

Conventionally, aluminum has been widely used for forming wirings of an LSI device. However, in recent years, copper has come to be used in place of aluminum in order to improve the RC delay of the wirings and enhance the resistance of the wirings to the electromigration (EM).

Since many copper compounds have a low vapor pressure, it is difficult to process copper by means of RIE (reactive ion etching). Therefore, the copper wiring is formed mainly by the damascene process.

In general, in the damascene process, wiring grooves are formed in a surface region of an insulating layer (interlayer dielectric) provided on a semi-conductor substrate, followed by forming a metal layer on the entire surface of the interlayer dielectric so as to fill the wiring grooves with the metal. Then, the unnecessary metal layer portion present over the interlayer dielectric outside the wiring grooves is removed by a chemical mechanical polishing (CMP) so as to form damascene wirings. Particularly, a process is called a dual damascene process (DD process), in which a via hole is also formed in the step of forming the wiring grooves in the interlayer dielectric, and the metal layer is formed in a manner to fill the wiring grooves and also fill the via hole so as to form damascene wirings within the wiring grooves and, at the same time, to form a via plug in the via hole. In general, a diffusion preventing layer (barrier layer) such as a TiN layer is formed on the inner walls of the wiring grooves (and the via hole, if formed) before formation of the metal layer, particularly, a copper layer, in order to prevent copper from diffusing into the interlayer dielectric. Also, in order to prevent the diffusion of the damascene wiring metal and the via plug metal, a second insulating layer (cap insulating layer) such as a silicon nitride layer is formed on the interlayer dielectric to cover the formed damascene wirings.

It should be noted that the damascene wiring metal, particularly copper tends to be readily oxidized, is thus oxidized by, for example, the oxygen present in the ambient atmosphere, with the result that an oxide film is formed on the surface of the damascene wiring layers. The oxide film thus formed increases the resistance of the damascene wirings, with the result that the damascene wirings fail to exhibit the merit of the low resistivity inherent in copper. Such being the situation, a reducing treatment is applied to the damascene wiring layer, before formation of the second insulating layer noted above, so as to remove the oxide film formed on the surface of the damascene wiring layers.

As a result of an extensive research, the present inventors have found that, in the conventional process, the metal atoms, particularly copper atoms, in the damascene wiring layers are migrated during the reducing treatment so as to bring about an abnormal migration of the metal. Because of the abnormal migration of the metal, the damascene wiring metal layers are caused to extend over the interlayer dielectric. If the adjacent damascene wirings are electrically connected to each other via the abnormally migrated metal, a leak current flows between the adjacent damascene wirings. If it is possible to secure a sufficient distance between the adjacent damascene wirings, the abnormally migrated metal does not bring about the problem pointed out above. However, the wirings are being made finer and finer in recent years, and the distance between the adjacent damascene wirings is being made smaller and smaller. It follows that the generation of the leak current noted above is practically unavoidable.

The present inventors have also found as a result of an extensive research that, in the conventional process, the oxide film formed on the damascene wiring layer is not removed sufficiently by the reducing treatment. If a second insulating layer such as a silicon nitride film is formed on the damascene wiring layer under the state that the oxide on the damascene wiring layer is not removed sufficiently, it is much difficult to obtain desired device characteristics. In addition, the yield of semiconductor devices is caused to be lowered.

BRIEF SUMMARY OF THE INVENTION

According to a first aspect of the present invention, there is provided a method of manufacturing a semiconductor device, comprising:

(a) providing a semiconductor substrate including a first insulating layer having a buried copper wiring formed in its surface region;

(b) monitoring a total partial pressure of oxygen and water vapor within a process chamber in which the semiconductor substrate is to be introduced;

(c) in case where the total partial pressure of oxygen and water vapor within the process chamber exceeds a prescribed value as a result of the monitoring, carrying out a treatment to lower the total partial pressure of oxygen and water vapor to a level not higher than the prescribed value;

(d) introducing the substrate into the process chamber in which the total partial pressure of oxygen and water vapor is not higher than the prescribed value;

(e) subjecting the copper wiring to a reducing treatment within the process chamber; and (f) forming a second insulating layer to cover the copper wiring which has been subjected to the reducing treatment.

According to a second aspect of the present invention, there is provided a method of manufacturing a semiconductor device, comprising:

providing a semiconductor substrate comprising a buried metal wiring;

estimating a state of oxidation on a surface of the metal wiring, followed by determining the conditions of a reducing treatment applied to the surface of the metal wiring based on the estimated state of oxidation and subsequently applying a reducing treatment to the surface of the metal wiring under the so determined conditions for the reducing treatment; and forming an insulating layer to cover the reduced metal wiring.

DETAILED DESCRIPTION OF THE INVENTION

Embodiments of the present invention will now be described more in detail below.

A first aspect of the present invention is directed to suppressing or preventing the abnormal migration of copper during a reducing treatment.

The present inventors have conducted an extensive research in an attempt to suppress or prevent the abnormal migration of copper that takes place when a copper wiring or interconnection is subjected to a reducing treatment. As a result, the present inventors have found that such an abnormal migration of copper is caused by oxidizing species, particularly oxygen and water vapor, present in the atmosphere within a process chamber in which the reducing treatment is carried out. The reducing treatment is carried out within the process chamber, in which a second insulating layer (cap insulating layer) such as a silicon nitride layer or a silicon carbide layer will be formed in the subsequent step, immediately before formation of the second insulating layer. The reduction treatment and the formation of the second insulating layer are repeatedly carried out within the same process chamber. As a result, oxygen and water vapor resulting from the formation of the second insulating layer or layers unavoidably remain within the process chamber. In addition or alternatively, these oxidizing species are adsorbed on the inner wall of the process chamber. It should be noted that these oxidizing species bring about the abnormal migration of copper when the copper wiring is subjected to the reducing treatment.

In order to suppress or prevent the abnormal migration of copper, a treatment to lower the residual oxygen concentration and the residual water vapor concentration within the process chamber is carried out immediately before the reducing treatment, according to one embodiment of the present invention. In other words, the abnormal migration of copper can be suppressed or prevented by controlling the total partial pressure of oxygen and water vapor within the process chamber at a sufficiently low level, i.e., a level not higher than a prescribed value.

Figure 1:
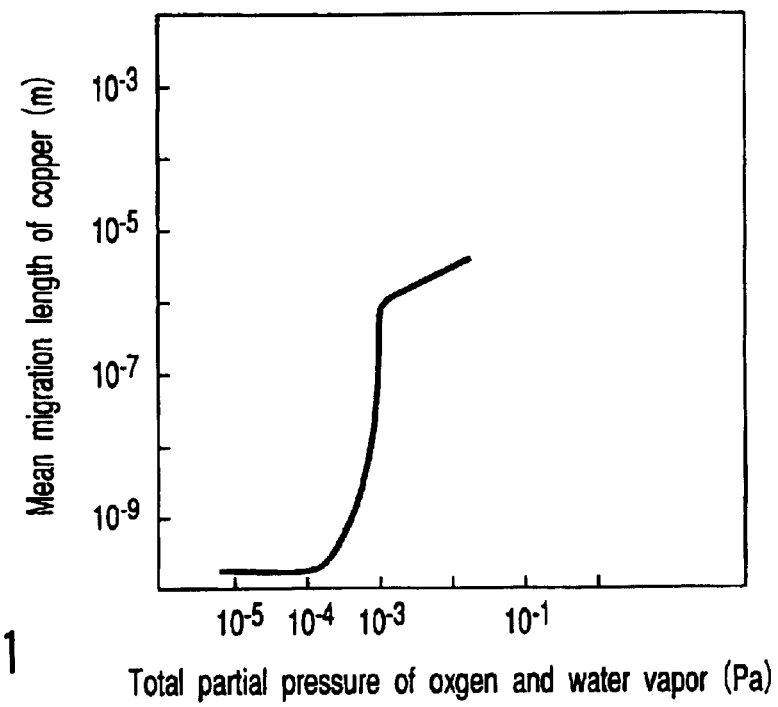
FIG. 1 is a graph showing the relationship between the total partial pressure of oxygen and water vapor and the migration length of copper.

The present inventors have applied a reducing treatment using an ammonia plasma to a copper damascene wiring formed within an insulating layer (interlayer dielectric) within a process chamber while changing the total partial pressure of oxygen and water vapor within the process chamber, and measured the average migration length of copper. FIG. 1 shows the result. The average migration length of copper referred to above is the average length between one edge of the copper wiring as viewed from above and the front edge of the migrated copper extending from the one edge of the copper wiring. The reducing treatment was carried out by allowing an $NH_3$ gas and a $N_2$ to flow into the process chamber at an $HN_3$ gas flow rate of 30 sccm and a $N_2$ gas flow rate of 2,500 sccm and by applying an RF power of 150W across the two parallel plate electrodes at a temperature of 400° C. so as to generate the ammonia plasma. The pressure within the process chamber was set at 4.2 Torr, the distance between the substrate and the opposing electrode was set at 8.83 mm (350 mils), and the time of the reducing treatment (plasma exposure time) was set at 15 seconds.

As shown in FIG. 1, the curve denoting the relationship between the total partial pressure of oxygen and water vapor and the mean migration length of copper has an inflection point at $10^{-3}$ Pa such that mean migration length of copper is increased with increase in the total partial pressure where the total partial pressure exceeds the inflection point. It follows that, in applying a reducing treatment to the copper wiring, it is desirable that the total partial pressure of oxygen and water vapor be maintained at a level not higher than $10^{-3}$ Pa.

Figure 2:
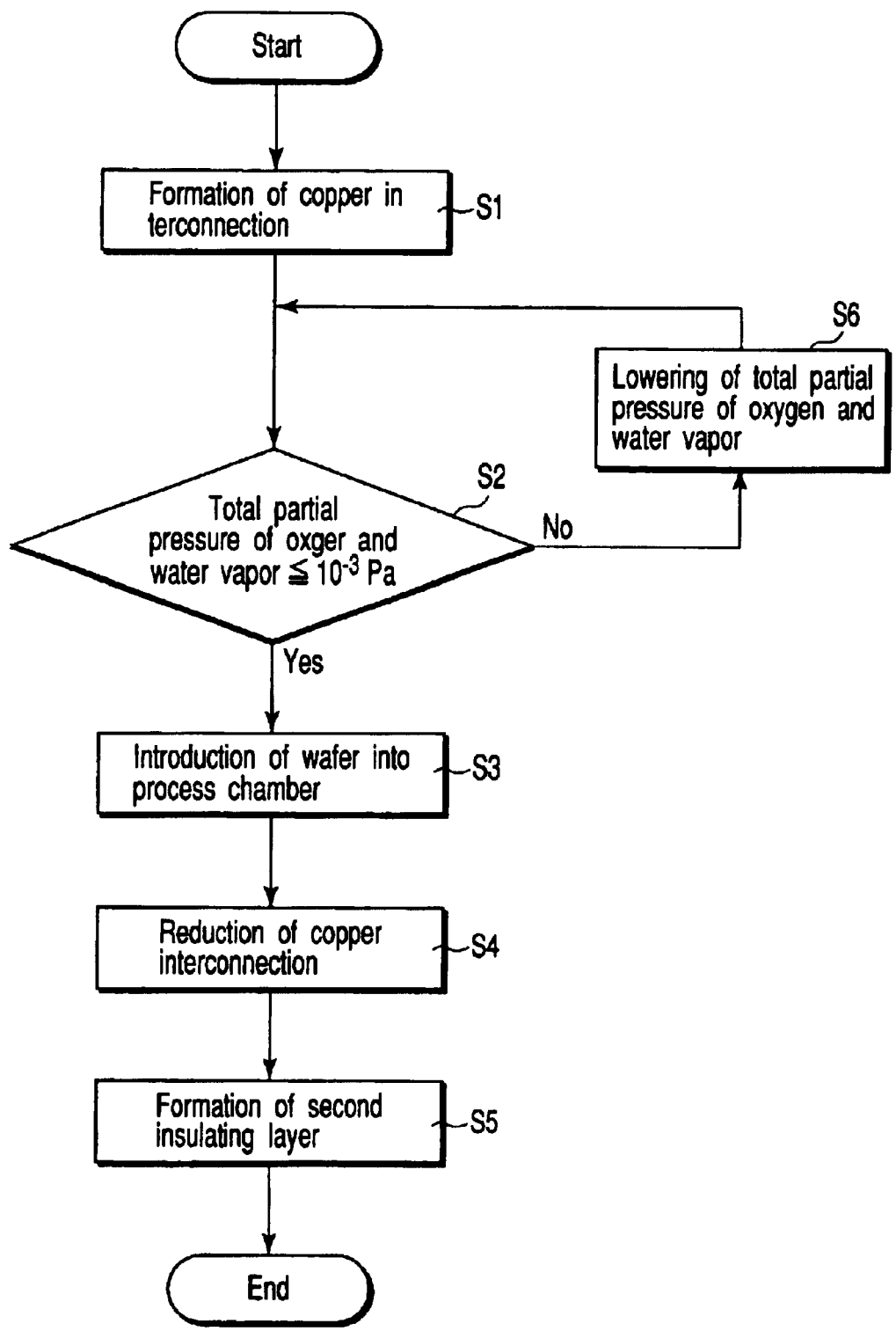
FIG. 2 is a flow chart showing a method of manufacturing a semiconductor device according to one embodiment of the present invention.

FIG. 2 is a flow chart showing a method of manufacturing a semiconductor device according to one embodiment of the present invention. The method comprises formation of a copper wiring (step S1), monitoring of the total partial pressure of oxygen and water vapor within a process chamber (step S2), introduction of a wafer into the process chamber (step S3), reducing treatment applied to the copper wiring (step S4), and formation of a second insulating layer (step S5). The method also comprises the lowering of the total partial pressure of oxygen and water vapor (step S6) that is employed in the case where the total partial pressure of oxygen and water vapor within the process chamber exceeds a prescribed value (preferably $10^{-3}$ Pa as shown in FIG. 2).

Figure 3A:
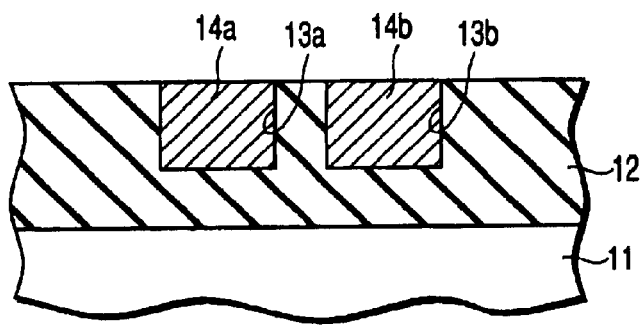
FIGS. 3A and 3B are cross sectional views collectively illustrating a method of manufacturing a semiconductor device according to one embodiment of the present invention.

In step S1, as shown in FIG. 3A, copper damascene wiring or interconnection layers 14a, 14b are formed above a semiconductor substrate 11 (e.g., a silicon substrate, a compound semiconductor substrate such as a SiGe substrate, or an SOI (silicon-on-insulator) substrate) by a damascene process well known per se in the art. The copper damascene wiring layers 14a, 14b are formed in a surface region of a first insulating layer (interlayer dielectric) 12 provided on the semiconductor substrate 11. As is well known in the art, a barrier layer (not shown) for preventing the copper diffusion, such as a TiN layer, is formed on the inner walls of the wiring grooves 13a, 13b before formation of the copper wiring layers 14a, 14b.

The interlayer dielectric 12 may be a silicon oxide layer, an organic insulating layer or a low-k dielectric layer, and can be formed by a CVD method or a coating method known per se in the art. The copper damascene wiring layers 14a, 14b can be formed by an electroplating method well known per se in the art. If the barrier layer is incapable of performing a sufficient function as a seed for the copper plating layer in conducting the electroplating, a thin copper layer may be formed on the barrier layer by a CVD method or a PVD method (such as a sputtering method or an evaporation method). After formation of the copper plating layer, a CMP processing is applied to the resultant copper layer so as to obtain the copper damascene wiring layers 14a, 14b.

In step S2, the total partial pressure of oxygen and water vapor in the atmosphere within a process chamber in which a second insulating layer will be formed is monitored. The process chamber may be a CVD chamber for forming the second insulating layer by a CVD method. As is well known in the art, the CVD chamber is provided with inlet conduit for introducing a CVD gas and an outlet conduit for exhausting the waste gas. Also, two parallel plate electrodes are arranged within the CVD chamber. An RF power is applied across the two parallel plate electrodes. The process chamber may be set at an inner pressure of 0.01 to 1000 Torr.

The total partial pressure of oxygen and water vapor within the process chamber can be measured by, e.g., a mass spectrometer arranged within the process chamber.

Where the total partial pressure of oxygen and water vapor has been found to be not higher than the prescribed value, preferably not higher than $10^{-3}$ Pa, the semiconductor substrate (wafer) having the copper damascene wirings formed in step S1 is introduced into the process chamber (step S3).

Then, a reducing treatment is applied to the surface of the copper damascene wirings or interconnections to remove an oxide film formed on the surface of the copper damascene wirings (step S4). The reducing treatment can be performed by a method well known per se in the art. For example, the reducing treatment can be performed by using an ammonia plasma. The ammonia plasma can be generated by, for example, applying an RF power across the two parallel plate electrodes while supplying an ammonia gas into the process chamber, usually together with a carrier gas such as a nitrogen gas. The reducing treatment can be performed within the process chamber at an inner pressure of 0.01 to 1000 Torr. and under temperatures ranging between 100° C. and 500° C. Where the oxide film formed on the copper damascene wirings is thick, it is possible to prolong the reducing treatment time or to increase the RF power.

After the reducing treatment, a second insulating layer (cap insulating layer) 15 is formed in step S5 on the interlayer dielectric 12 in a manner to cover the upper surfaces of the copper wirings 14a, 14b within the same process chamber without breaking the reduced pressure within the process chamber by the method well known in the art. The second insulating layer 15 may be a silicon nitride layer or a silicon carbide layer. Where the second insulating layer 15 is formed of silicon nitride, the second insulating layer 15 can be formed conveniently by supplying a silicon source gas such as a silane gas into the ammonia plasma atmosphere under which the reducing treatment has been carried out in the reducing treatment.

Where the total partial pressure of oxygen and water vapor within the process chamber has been found to exceed the prescribed value ($10^{-3}$ Pa) in step S2, a treatment to lower the total partial pressure of oxygen and water vapor is carried out (step S6).

The treatment to lower the total partial pressure of oxygen and water vapor can be performed by flowing a reducing gas such as a hydrogen gas, a silane gas and/or an ammonia gas through the process chamber (procedure 1). The oxygen and water vapor within the process chamber are reduced by the reducing gas so as to lose the oxidizing capability. The reducing gas can be flowed within the process chamber maintained at temperatures falling with a range of between 100° C. and 500° C. The reducing gas can be introduced into the process chamber, usually together with a carrier gas such as a nitrogen gas. The reducing gas can be flowed within the process chamber at a flow rate of 5 to 1000 sccm.

The treatment to lower the total partial pressure of oxygen and water vapor can also be performed by forming a plasma within the process chamber so as to strike out the oxygen molecules and water molecules adsorbed on the inner wall of the process chamber (procedure 2). It is possible to use an argon gas, a nitrogen gas, a nitrogen trifluoride gas ($NF_3$ gas), or a mixture of a carbon tetrafluoride gas ($CF_4$ gas) and an oxygen gas. An oxygen gas should riot be used singly so as to avoid the oxidation of the copper wirings. Particularly, in the case of using a mixture of carbon tetrafluoride gas and oxygen gas, the carbon tetrafluoride gas and the oxygen gas are reacted, in generating the plasma, to form a fluorine gas together with a carbon monoxide gas and a carbon dioxide gas. The fluorine gas can etch the inner wall of the process chamber. The nitrogen trifluoride gas also generates a fluorine gas performing such an etching function.

The treatment to lower the total partial pressure of oxygen and water vapor can also be performed by covering the entire inner wall of the process chamber with a silicon nitride film (procedure 3). The silicon nitride film covering the inner wall of the process chamber serves to confine the oxygen and water vapor adsorbed on the inner wall of the process chamber, preventing the oxygen molecules and the water molecules from being released from the inner wall of the process chamber. The silicon nitride film can be formed by a CVD method well known in the art. For example, a silicon-containing gas such as a silane gas and a nitrogen-containing gas such as an ammonia gas are introduced into the process chamber together with a carrier gas such as a nitrogen gas. An RF power is then applied across the parallel plate electrodes so as to carry out the reaction between the silicon-containing gas and the nitrogen-containing gas, thereby allowing a silicon nitride film to be deposited on the inner wall of the process chamber. The silicon nitride film is formed to cover the parallel plate electrodes arranged within the process chamber as well as the inner wall of the process chamber.

It is desirable that the silicon nitride film formed on the inner wall of the process chamber have a thickness not smaller than 15 nm. If the thickness of the silicon nitride film is smaller than 15 nm, the number of pinholes tends to increase in the resultant silicon nitride film so as to cause the silicon nitride film to have a lowered capability of shielding oxygen and water vapor. Also, the silicon nitride film having a thickness not smaller than 15 nm is capable of sufficiently preventing the diffusion of copper. The thickness that permits preventing the copper diffusion corresponds to a thickness that permits preventing, without fail, the diffusion of water vapor having a diffusion coefficient smaller than that of copper.

At least two of procedures 1 to 3 given above for lowering the total partial pressure of oxygen and water vapor to a level not higher than a prescribed value (preferably not higher than $10^{-3}$ Pa) can be used simultaneously in combination.

After the treatment to lower the total partial pressure of oxygen and water vapor described above, the process is brought back to step S2 so as to monitor again whether the total partial pressure of oxygen and water vapor within the process chamber is not higher than the prescribed value, preferably not higher than $10^{-3}$ Pa. Where the total partial pressure of oxygen and water vapor has been found to be not higher than the prescribed value, preferably not higher than $10^{-3}$ Pa, the process proceeds to step S3, to step S4 and, then, to step S5. On the other hand, where the total partial pressure of oxygen and water vapor has been found to exceed the prescribed value, preferably $10^{-3}$ Pa, the treatments in steps S6 and S2 are repeated until the total partial pressure of oxygen and water vapor is lowered to not higher than the prescribed value, preferably not higher than $10^{-3}$ Pa.

Incidentally, after the cap insulating layer 15 is formed on one wafer and the wafer is taken out of the process chamber, steps S2 to S6 are performed every time a cap insulating layer is formed on the next wafer.

As described above, according to the first aspect of the present invention, the reducing treatment is applied to the copper damascene wiring under an atmosphere in which the total partial pressure of oxygen and water vapor is maintained at a level not higher than a prescribed value, preferably not higher than $10^{-3}$ Pa, so as to suppress or prevent the abnormal migration of copper. As a result, it is possible to suppress effectively the generation of a leak current between adjacent copper wirings, which is caused by the abnormal migration of copper. Further, since the increase in the leak current can be suppressed, it is possible to lower the crosstalk between the adjacent copper wirings, to lower the power consumption during the waiting time of the element or the device, and to prevent the malfunction of the element, with the result that it is possible to form a semiconductor device having good characteristics.

A second aspect of the present invention is directed to a uniform removal of an oxide layer formed on the metal damascene wiring or interconnection. It is possible to suppress the nonuniformity in the characteristics of the resultant semiconductor device by uniformly removing the oxide film.

The metal damascene wiring or interconnection such as copper damascene is subjected to various surface treatments after the CMP processing. Such treatments include a treatment with a dilute hydrochloric acid or a treatment with an ammonia water for stabilizing the surface of the copper wiring, and a treatment with a dilute hydrofluoric acid for removing the copper oxide. Also, in order to prevent the oxidation during storage under the air atmosphere, the metal damascene wiring is sometimes coated with a corrosion inhibitor such as benzotriazole (BTA). The oxidized state on the surface of the metal damascene wiring can be changed upon such surface treatments. It has been found that the oxidized state of the metal damascene wiring is governed almost by the contact time between the metal damascene wiring subjected to the surface treatment and the air atmosphere. More specifically, it is possible to remove uniformly the oxide film formed on the surface of the metal damascene wiring by estimating the thickness of the oxide film based on the history up to the time when the cap insulating layer is formed on the metal damascene wiring, i.e., based on the contact time of the metal damascene wiring with the air until the cap insulating layer is formed on the metal damascene wiring, and by setting the conditions sufficient for removing the estimated thickness of the oxide film. The thickness of the oxide film can be estimated by obtaining in advance the relationship between the contact time of the metal damascene wiring with the air and the thickness (by analysis) of the oxide film formed during the contact time. In estimating the thickness of the oxide film, it is also possible to take into account the surface treatment applied to the metal damascene wiring. If the thickness of the oxide film is known, it is possible to determine the optimum conditions for a reducing treatment to remove the oxide film.

It should be noted that, if the substrate having the metal damascene wiring after the surface treatment is not stored in a so-called "ion box" provided with an sulfur ion filter for removing the sulfur ions but is exposed to the air atmosphere, an oxide film is formed on the surface of the metal damascene wiring. In addition, sulfur and sulfur oxides within the air atmosphere are attached to the surface of the metal damascene wiring. It is difficult to reduce sulfur and the sulfur oxides, particularly, the sulfur oxides, compared with the reduction of the metal oxide such as copper oxide. In such a case, the amount of sulfur or the sulfur oxides, particularly, the amount of the sulfur oxides, is estimated on the basis of the contact time between the metal damascene wiring and the air so as to set the conditions for the reducing treatment. Under the reducing conditions that permit removing sulfur and the sulfur oxides, copper oxide can also be removed. Incidentally, the sulfur amount on the surface of the metal wiring can be measured accurately by TOFSIMS analysis.

Alternatively, sulfur and the sulfur oxides on the metal damascene wiring can be removed by a washing treatment. For example, sulfur and the sulfur oxides can be removed by washing the metal damascene wiring with a citric acid, a dilute hydrofluoric acid and an ammonia water successively. After removal of the sulfur oxides, the thickness of the oxide film formed on the metal damascene wiring is estimated as noted above so as to set the optimum reducing conditions for removing the oxide film.

In order to prevent sulfur or sulfur oxides from depositing on the surface of the metal damascene wiring, the semiconductor wafer may be stored in a sealed box, i.e., an ion box, equipped with an ion filter capable of removing sulfur ions, immediately after the metal damascene wiring is subjected to a CMP processing and is subjected to the surface treatment described above. It should be noted, however, that the ambient air is circulated within the sealing box, with the result that the metal damascene wiring may be oxidized during storage of the wafer in the sealing box. It is possible to determine the optimum conditions for the reducing treatment for removing the oxide film formed on the metal damascene wiring by estimating the thickness of the oxide film based on the storing time of the semiconductor wafer in the sealing box.

The reducing treatment noted above can be achieved by applying an ammonia plasma treatment to the metal damascene wiring. In this case, the reducing rates of the oxide film and the sulfur oxide under the plasma generating conditions can be obtained in advance by preliminary experiments for the individual ammonia plasma generating conditions. As a result, it is possible to know the reducing rates of the oxide film and the sulfur oxide under the plasma generating conditions that are actually employed. It follows that it is possible to determine a plasma processing time required for removing the estimated amount (thickness) of the oxide film and the sulfur oxide film. It is desirable for the plasma processing time to be longer than the time obtained by the calculation noted above. In order to achieve the uniform removal of the oxide film and the sulfur oxide film, it is more desirable for the actual plasma processing time to be about twice as long as the time obtained by the calculation.

Figure 4A:
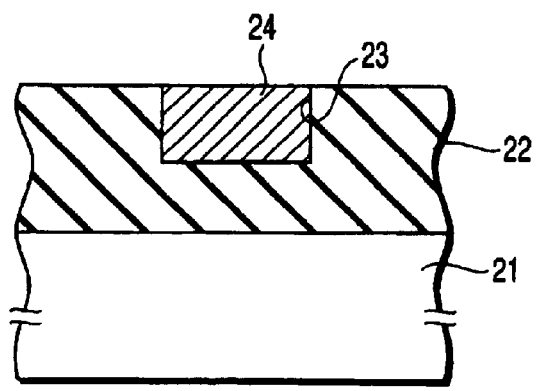
FIGS. 4A to 4C are cross sectional views collectively illustrating a method of manufacturing a semiconductor device according to another embodiment of the present invention.
Figure 4B:
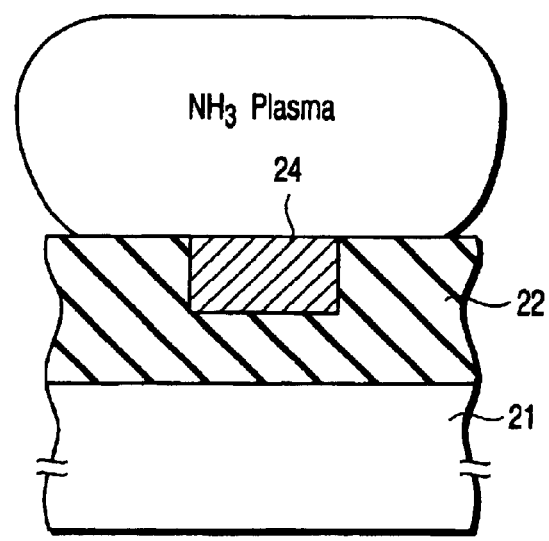
Figure 4C:
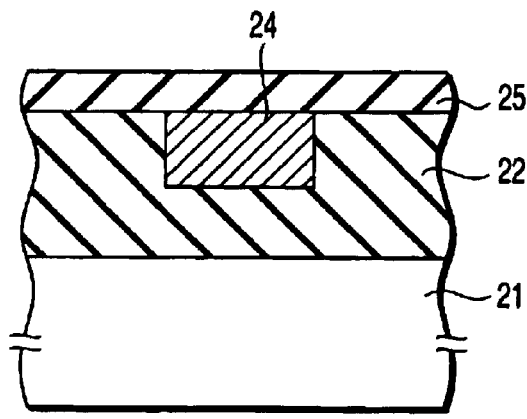

FIGS. 4A to 4C are cross sectional views collectively illustrating a method of manufacturing a semiconductor device according to the second aspect of the present invention. First, a metal damascene wiring or interconnection 24 is formed on a semiconductor substrate 21 such as a silicon substrate, a compound semiconductor substrate such as a SiGe substrate or an SOI (silicon-on-insulator) substrate by the damascene process well known pre se in the art. The damascene metal wiring 24 is formed in a wiring groove 23 formed in a surface region of an interlayer dielectric 22 formed on the semiconductor substrate 21. As is well known in the art, a barrier layer (not shown) is formed on the inner wall of the wiring groove 23 before the formation of the metal wiring 14, in order to prevent the copper diffusion.

The interlayer dielectric 22 may be a silicon oxide layer, an organic insulating layer or a low-k dielectric layer, and can be formed by a CVD method or a coating method known per se in the art. The metal damascene wiring 24 can be formed by an electroplating method as is well known in the art. Where the barrier layer fails to perform sufficiently the function of a seed for the plating layer, a thin metal layer may be formed on the barrier layer by a CVD method or a PVD method (sputtering, evaporation), as is well known in the art. After formation of the plating layer, a CMP process is applied to the formed plating layer so as to obtain the damascene wiring layer 24. It is possible for the wiring layer 24 to be formed of copper or a metal, other than copper, susceptible to oxidation, such as aluminum or tungsten.

Then, the wafer of the construction shown in FIG. 4A is introduced into a process chamber (not shown) for forming a second insulating layer, and the metal wiring 24 is subjected to an ammonia plasma processing for the reducing purpose under the optimum conditions determined by the procedures described previously (FIG. 4B). The process chamber may a CVD chamber for forming a second insulating layer by a CVD method. As is well known in the art, the CVD chamber is provided with an inlet conduit for introducing a CVD gas and an outlet conduit for exhausting the waste gas. Also, two parallel plate electrodes are arranged within the CVD chamber. An RF power is applied across the two parallel plate electrodes. The reducing treatment can be carried out within the process chamber at an inner pressure of 0.01 to 1000 Torr. and under temperatures falling within a range of between 100° C. and 500° C.

Subsequent to the reducing treatment, a second insulating layer (cap insulating layer) 25 is formed on the insulating layer 22 in a manner to cover the upper surface of the copper wiring 24 within the same process chamber without breaking the reduced pressure within the process chamber, by a CVD method known per se in the art. The second insulating layer 25 may be a silicon nitride layer or a silicon carbide layer. Where the second insulating layer 25 is formed of silicon nitride, the second insulating layer 25 can be formed conveniently by supplying a silicon source gas such as a silane gas into the ammonia plasma atmosphere under which the reducing treatment has been carried out in the preceding step.

In one embodiment of the present invention, it suffices for the surface of the metal damascene wiring to be reduced such that the oxygen concentration at the surface is lowered to $1 \times 10^{21}/cm^3$. This implies that the nonuniformity in the removal of the metal oxide film, particularly, the copper oxide, is rendered sufficiently small. If the reducing treatment is carried out until the oxygen concentration in the surface region is lowered to $1 \times 10^{21}/cm^3$ or less, the semiconductor device that is to be obtained is rendered substantially free from nonuniformity in the characteristics, improving the yield of the semiconductor devices. This oxygen concentration is maintained constant by the cap insulating layer that is formed later. Incidentally, for measuring the oxygen concentration, a sample for evaluation, which is substantially the same in construction as the semiconductor wafer that is to be subjected to the reducing treatment, is housed in the reducing process chamber together with the semiconductor wafer that is to be subjected to the reducing treatment. The oxygen concentration can then be measured for the sample for evaluation after completion of the reducing treatment so as to obtain the oxygen concentration. Needless to say, it is possible to put a plurality of semiconductor wafers in the reducing process chamber for applying simultaneously the reducing treatment to the plural semiconductor wafers and subsequently forming the second insulating layer on each of the semiconductor wafers.

Figure 5:
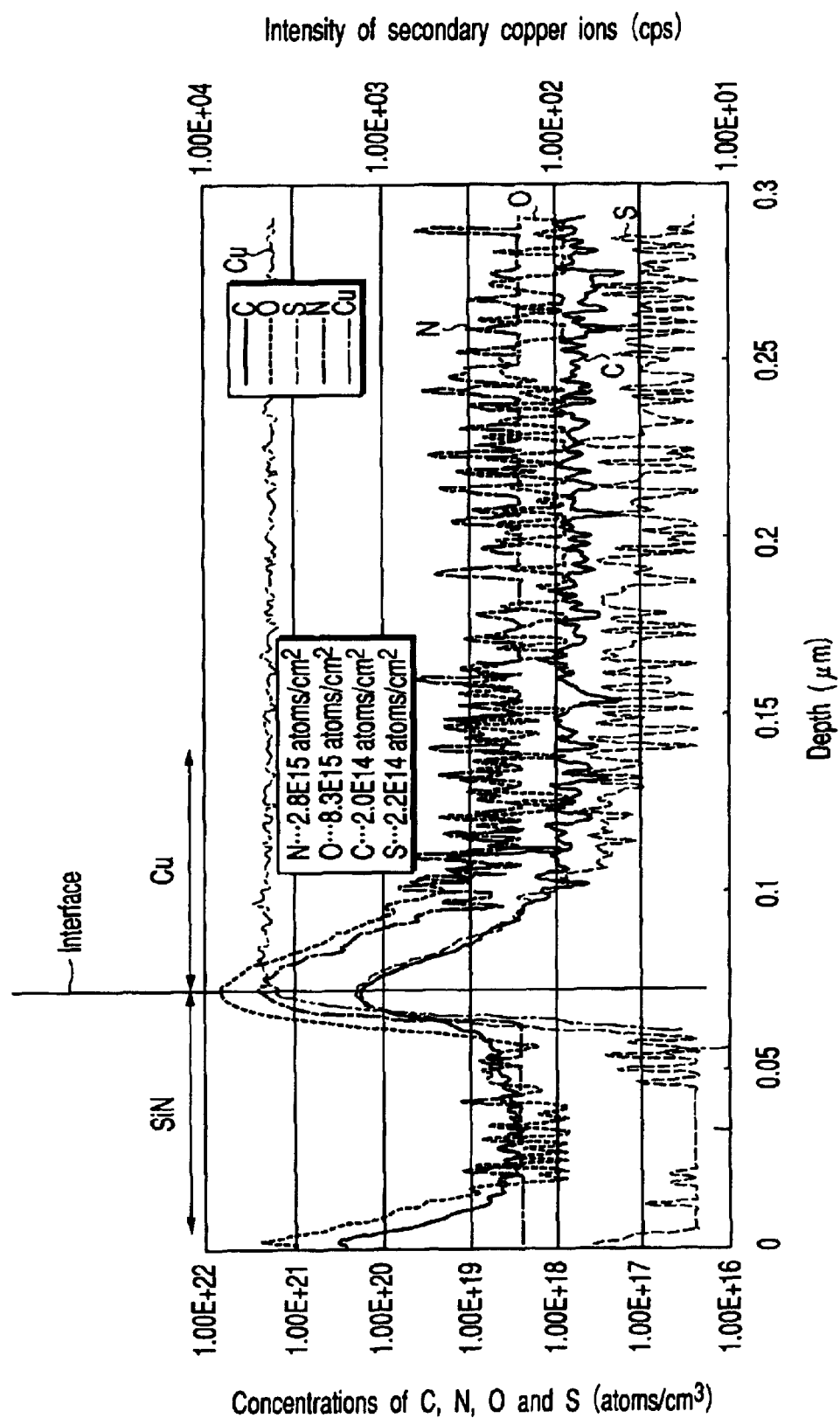
FIG. 5 is a graph showing the result of the SIMS analysis of the SiN/Cu interface in the case where the reducing treatment is insufficient.
Figure 6:
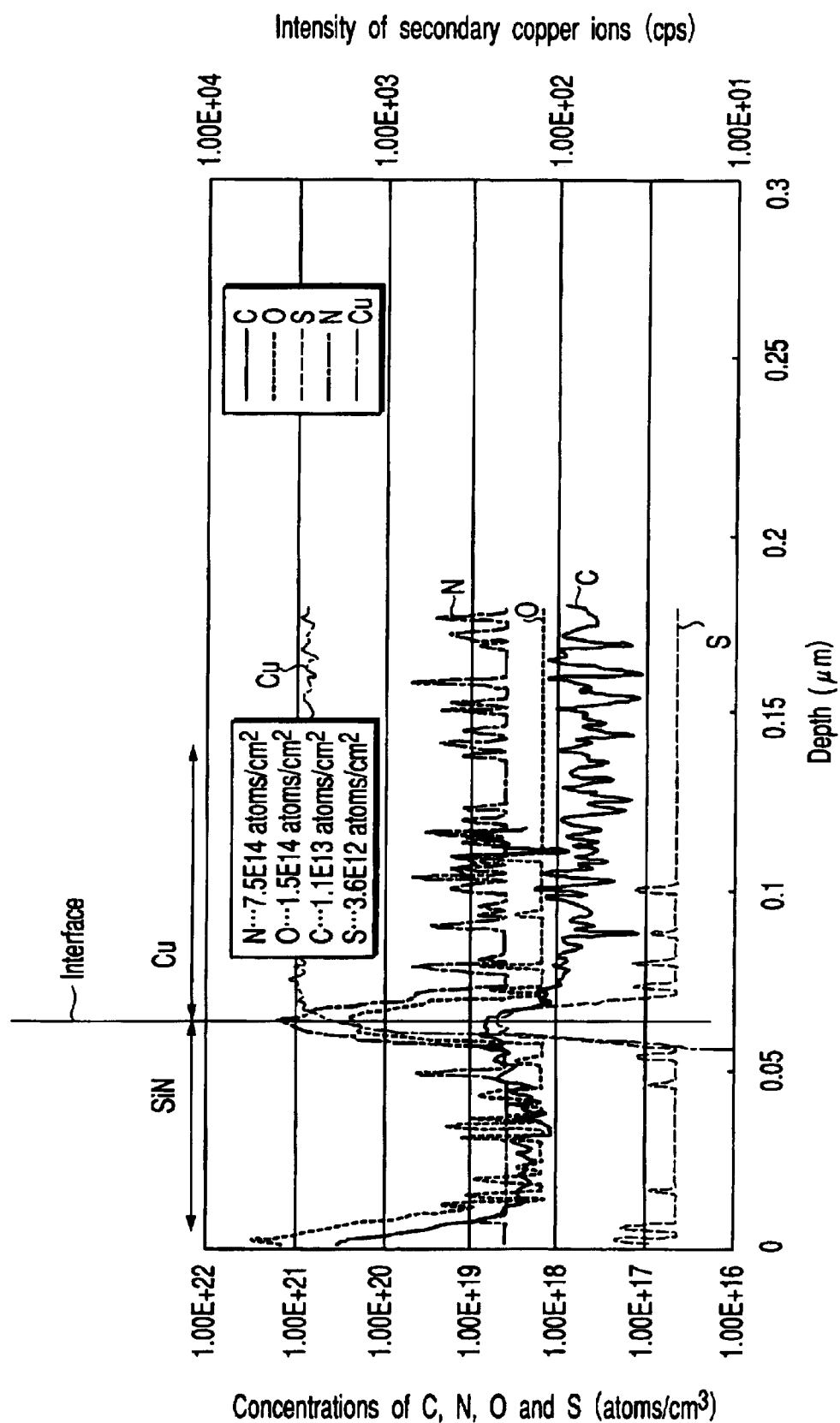
FIG. 6 is a graph showing the result of the SIMS analysis of the SiN/Cu interface in the case where the reducing treatment is sufficient.

FIG. 5 shows the result of the SIMS analysis applied to the interface between the cap insulating layer formed of silicon nitride and the copper wiring, i.e., SiN/Cu interface, covering the case where the reducing treatment was insufficient. FIG. 6 shows the result of the similar SIMS analysis, covering the case where the reducing treatment was sufficient.

It has been confirmed that, where the oxygen concentration at the SiN/Cu interface exceeds $1 \times 10^{21}/cm^3$, the adhesion between the SiN layer and the Cu wiring is lowered, the leak current between adjacent wirings is increased, and the EM resistance is deteriorated, as shown in FIG. 5. On the other hand, where the oxygen concentration at the SiN/Cu interface is not higher than $10^{21}/cm^3$, the decrease in the adhesion between the SiN layer and the Cu wiring, the increase in the leak current between adjacent wirings is increased and the deterioration in the resistance to EM were not observed, as apparent from FIG. 6.

More specifically, the adhesion strength (toughness) between the SiN layer and the Cu wiring measured by the MELT method was found to be $0.10$ MPa·m$^{1/2}$ in the case where the reduction was insufficient (FIG. 5). On the other hand, the adhesion strength (toughness) between the SiN layer and the Cu wiring was found to be $0.50$ MPa·m$^{1/2}$ in the case where the reduction was sufficient (FIG. 6), which is about 5 times as high as that in the case where the reduction was insufficient. If the SiN/Cu interface has such a high adhesion strength, the film peeling does not take place in the wiring step and the reliability (EM resistance) described herein later is improved. Incidentally, in the MELT method referred to above, a SiN layer is formed on a sample (metal wiring) for measuring the adhesivity, and the temperature is lowered from a high temperature so as to measure the temperature at which the SiN layer is peeled off because of the stress generated between the metal wiring and the SiN layer. The adhesion strength (toughness) is obtained from the peeling temperature in the MELT method.

Figure 7:
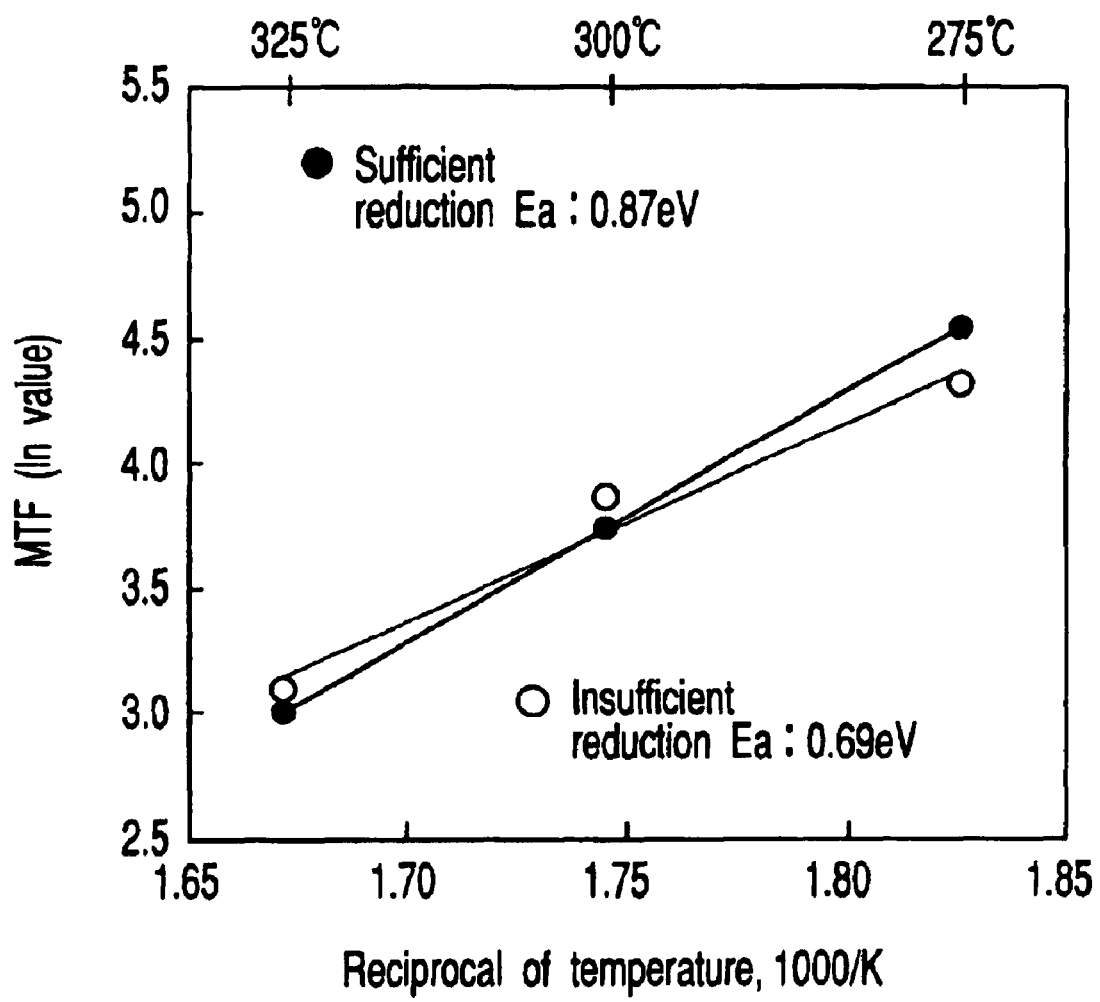
FIG. 7 is a graph showing the relationship between the mean time failure (MTF) of the semiconductor device and the temperature, covering the cases where the reduction is sufficient and insufficient.

It has also been found that the activation energy Ea of the copper wiring was 0.69 eV in the case where the reduction was insufficient, whereas the activation energy Ea of the copper wiring was very high, i.e., 0.87 eV, in the case where the reduction was sufficient. Also, as shown in the graph of FIG. 7, it has been experimentally confirmed that the case where the reduction was sufficient (Ea=0.87 eV) was superior to the case where the reduction was insufficient (Ea= 0.69 eV) in the mean time failure (MTF) of the resultant semiconductor devices. Incidentally, the difference in the mean time failure between the case where the reduction was sufficient and the case where the reduction was insufficient seems to be small in FIG. 7. It should be noted in this connection that the data plotted in the graph of FIG. 7 were obtained from the experiments conducted under temperatures falling within a range of between 275° C. and 325° C. If the two lines shown in FIG. 7 are extrapolated toward the room temperature, the difference between the two lines is further increased. In addition, the natural logarithmic value (ln) is plotted on the ordinate of the graph of FIG. 7. It follows that the difference in the mean time failure of the semiconductor device is sufficiently larger than that visually recognized from FIG. 7.

Under the circumstances, it is desirable to further coduct the reducing treatment until the oxygen concentration is lowered to $1 \times 10^{21}/cm^3$ in the case where the oxygen concentration in the surface region of the metal wiring after the reducing treatment has been found to exceed $1 \times 10^{21}/cm^3$.

According to the second aspect of the present invention, the oxide film formed on the surface of the damascene wiring layer can be sufficiently removed by the reducing treatment so as to make it possible to suppress the nonuniformity in the characteristics of resultant semiconductor device to a low level and, thus, to improve yield of the device.

Examples of the present invention will now be described below.

EXAMPLE 1

A wafer of the construction shown in FIG. 3A was prepared.

Before introduction of the wafer into the CVD chamber, the total partial pressure of oxygen and wafer within the CVD chamber was measured by a mass spectrometer and found to have exceeded $10^{-3}$ Pa. Therefore, procedure 1, 2 or 3 given below was performed:

<Procedure 1>

A silane gas as a reducing gas was introduced together with a nitrogen gas into the CVD chamber at 400° C. for one minute, with the flow rates of the silane gas and the nitrogen gas set at 100 sccm and 1,000 sccm, respectively. Then, the total pressure of oxygen and water vapor within the CVD chamber was measured by a mass spectrometer and was found to have been lowered to a level not higher than $10^{-3}$ Pa.

<Procedure 2>

A plasma was generated by introducing $CF_4$, $O_2$ and $N_2$ into the CVD chamber at 400° C. with the flow rates of $CF_4$, $O_2$ and $N_2$ set at 680 sccm, 60 sccm and 210 sccm, respectively, and by applying an RF power of 750W to a pair of parallel plate electrodes. The pressure within the CVD chamber was 4.6 Torr, and the distance between the substrate and the opposing electrode was 15.24 mm (600 mils). Then, the total pressure of oxygen and water vapor within the CVD chamber was measured by a mass spectrometer and was found to have been lowered to a level not higher than $10^{-3}$ Pa.

<Procedure 3>

A plasma was generated by introducing $SiH_4$, $NH_3$ and $N_2$ into the CVD chamber at 400° C. with the flow rates of $SiH_4$, $NH_3$ and $N_2$ set at 100 sccm, 60 sccm and 2550 sccm, respectively, and by applying an RF power of 390W to a pair of parallel plate electrodes. The pressure within the CVD chamber was 5.0 Torr, and the distance between the substrate and the electrode was 10.668 mm (420 mils). In this fashion, the inner wall of the CVD chamber was kept exposed to the plasma for 8 seconds so as to form a silicon nitride film having a thickness of 50 nm on the entire inner wall of the CVD chamber. Then, the total pressure of oxygen and water vapor within the CVD chamber was measured by a mass spectrometer and was found to have been lowered to a level not higher than $10^{-3}$ Pa.

After the total pressure of oxygen and water vapor within the CVD chamber was lowered to a level not higher than $10^{-3}$ Pa in this way, the wafer was introduced into the CVD chamber so as to apply a reducing treatment to the copper wiring. Specifically, an ammonia plasma was generated by supplying an $HN_3$ gas and a $N_2$ gas into the CVD chamber with the flow rates of the $HN_3$ gas and the $N_2$ gas set at 30 sccm and 2,500 sccm, respectively, and by applying an RF power of 150W at 400° C. to the parallel plate electrodes. The pressure within the CVD chamber was 4.2 Torr, and the distance between the substrate and the electrode was 8.83 mm (350 mils). The surface of the copper wiring was exposed to the ammonia plasma for 15 seconds so as to remove the oxide film formed on the surface of the copper wiring. The surface of the copper wiring after removal of the oxide film was observed, with the result that an abnormal migration of copper was scarcely observed.

Figure 3B:
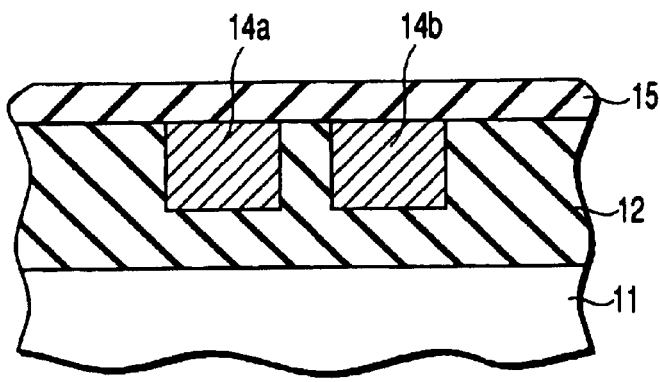

Then, a plasma was kept generated for 20 seconds by supplying continuously a silane gas together with an ammonia gas and a nitrogen gas into the ammonia plasma without breaking the vacuum, with the flow rates of the silane gas, the ammonia gas and the nitrogen gas set at 50 sccm, 25 sccm and 2,800 sccm, respectively, and by applying an RF power of 320W to the parallel plate electrodes at 400° C. The pressure within the CVD chamber was 4.4 Torr, and the distance between the substrate and the electrode was 10.16 mm (400 mils). As a result, formed was a silicon nitride film having a thickness of 70 nm as the cap insulating layer, as shown in FIG. 3B.

EXAMPLE 2

A wafer constructed as shown in FIG. 4A, which included a silicon substrate and a copper wiring, was prepared by a damascene process including the final CMP processing, followed by subjecting the surface of the copper wiring 24 to a surface treatment such as washing with a citric acid, a treatment with a dilute hydrochloric acid or a treatment with a dilute hydrofluoric acid so as to remove as much as possible the copper oxide on the copper wiring and the residue after the CMP processing of the damascene process. Further, the copper wiring 24 was subjected to a surface treatment with an ammonia water so as to stabilize the surface of the copper wiring 24.

Then, the thickness of the oxide film (copper oxide film) that remained unremoved on the surface of the copper wiring was estimated on the basis of the time during which the silicon substrate 21 after the surface treatment and having the copper wiring formed thereon was left to stand. In this Example, the silicon substrate 21 having the copper wiring formed thereon was left to stand for 48 hours after the surface treatment, and the washing with citric acid, a treatment with a dilute hydrofluoric acid and a treatment with an ammonia water were employed as the surface treatment. Therefore, the thickness of the copper oxide film was estimated to be 20 nm or less based on the stored data.

Then, the silicon substrate 21 was introduced into a plasma CVD chamber for forming a silicon nitride film.

Thereafter, an $NH_3$ plasma processing was performed within the chamber for reduction of the surface of the copper wiring and for removal of the organic contaminant. Specifically, an $NH_3$ gas and a $N_2$ gas were introduced into the chamber with the flow rates of the $NH_3$ gas and the $N_2$ gas set at 30 sccm and 2,500 sccm, respectively. An RF power of 150W was applied at 400° C. to the parallel plate electrodes. The pressure within the chamber was 4.2 Torr, and the distance between the substrate and the opposing electrode was 0.889 cm (350 mils).

It has been determined in the preliminary experiments that the reduction rate of the copper oxide under the ammonia plasma generation conditions given above is 80 nm/min. Therefore, since the thickness of the copper oxide film was estimated to be 20 nm or less, the plasma processing time was calculated to be 15 seconds, based on the reduction rate of copper oxide. In view of the uniformity of the plasma reducing treatment and the nonuniformity in the thickness of the copper oxide film, 100% of an overtime was added to the processing time noted above. Therefore, the actual processing time was 30 seconds.

Then, a $SiH_4$ gas was introduced into the $NH_3$ plasma noted above so as to form a silicon nitride film 25 to a thickness of 70 nm on the interlayer dielectric 22. The plasma CVD conditions were: flow rates of $SiH_4/NH_3/N_2$= 50/25/2,800 sccm; temperature=400° C.; RF power=320W; pressure=4.4 Torr; distance between substrate and electrode=1.016 cm (=400 mils); and the plasma generation time=about 20 seconds.

The oxygen concentration at the SiN/Cu interface in the semiconductor structure thus obtained was measured and found to be $1\times10^{21}/cm^3$ or less.

EXAMPLE 3

In this Example, a silicon substrate 21 comprising a copper wiring subjected to a surface treatment as in Example 2 was left to stand for 48 hours under an atmosphere in which the atmospheric ions were not controlled. In this case, a large amount of sulfur and $SO_x$ present in the air atmosphere were attached to the surface of the copper wiring. The sulfur concentration on the surface of the copper wiring was found to be $8\times10^{12}/cm^2$ by the measurement with FOTSIMS.

Then, the silicon substrate 21 having the copper wiring 24 formed thereon was introduced into a plasma CVD chamber similar to that used in Example 2, and a $NH_3$ plasma processing was carried out in the plasma CVD chamber for the reduction of the surface of the copper wiring 24 and for removal of the organic contaminant prior to formation of a silicon nitride film. The conditions for the $NH_3$ plasma generation were equal to those in Example 2. Therefore, the reduction rate of copper oxide under the conditions referred to above was 80 nm/min. Also, it has been determined by the preliminary experiments that the reduction rate of sulfur oxide under the same plasma generation conditions was $2\times10^{11}/cm^2 \cdot sec$.

Example 3 differs from Example 2 in that the reducing treatment time was determined on the basis of sulfur oxide. Specifically, the reducing treatment time was calculated to be 40 seconds. However, in view of, for example, the uniformity of the $NH_3$ plasma reducing treatment, it is necessary to add 100% of an overtime to the calculated processing time noted above. Therefore, the actual processing time was set at 80 seconds.

Then, a silicon nitride layer 25 having a thickness of 70 nm was formed on the interlayer dielectric 22 having the copper wiring formed therein, as in Example 2.

The oxygen concentration at the SiN/Cu interface in the semiconductor structure thus obtained was measured and found to be $1\times10^{21}/cm^3$ or less.

EXAMPLE 4

A semiconductor wafer having sulfur oxide attached to the surface thereof as in Example 3 was washed with citric acid and, then, washed with a dilute hydrofluoric acid, followed by treatment with ammonia water so as to remove the sulfur oxide.

Then, an ammonia plasma was generated under the conditions the same as those in Example 2.

In the wafer of Example 4, the copper wiring was formed by the process the same as that employed in Example 2. Thus, the thickness of the copper oxide film was estimated to be 20 nm or less. Such being the situation, the $NH_3$ plasma processing was carried out for 30 seconds for the same reasons discussed previously in conjunction with Example 2.

Finally, a silicon nitride layer 25 having a thickness of 70 nm was formed on the copper wiring, as in Example 2.

The oxygen concentration at the SiN/Cu interface in the semiconductor structure thus obtained was measured and found to be $1\times10^{21}/cm^3$ or less.

EXAMPLE 5

A semiconductor wafer comprising a copper wiring subjected to a surface treatment was prepared as in Example 2. Immediately after the preparation, the semiconductor wafer was housed in a sealed box equipped with an ion filter capable of controlling the sulfur ions and left to stand in the sealed box for 48 hours. As a result, it was possible to suppress the adsorption of the sulfur oxide on the surface of the copper wiring.

In Example 5, the semiconductor wafer was left to stand within the sealed box for 48 hours, and the surface treatment was performed by the treatments with citric acid, with hydrofluoric acid, and with ammonia water. Therefore, the thickness of the copper oxide film was estimated as 20 nm or less as in Example 2.

Then, an $NH_3$ plasma processing was applied for 30 seconds, as in Example 2.

Finally, a silicon nitride layer 25 was formed to a thickness of 70 nm, as in Example 2.

The oxygen concentration at the SiN/Cu interface in the semiconductor structure thus obtained was measured and found to be $1\times10^{21}/cm^3$ or less.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   (a) providing a semiconductor substrate including a first insulating layer having a buried copper wiring formed in its surface region;
   (b) monitoring a total partial pressure of oxygen and water vapor within a process chamber in which said semiconductor substrate is to be introduced;
   (c) in case where the total partial pressure of oxygen and water vapor within said process chamber exceeds a prescribed value as a result of said monitoring, carrying out a treatment to lower the total partial pressure of oxygen and water vapor to a level not higher than said prescribed value;
   (d) introducing said substrate into said process chamber in which the total partial pressure of oxygen and water vapor is not higher than said prescribed value;

(e) subjecting said copper wiring to a reducing treatment within said process chamber; and (f) forming a second insulating layer to cover the copper wiring which has been subjected to said reducing treatment.

2. The method according to claim 1, wherein the total partial pressure of oxygen and water vapor within said process chamber is set at $10^{-3}$ Pa or less.

3. The method according to claim 1, wherein the treatment to lower the total partial pressure of oxygen and water vapor to a level not higher than said prescribed value comprises supplying a reducing gas into said process chamber.

4. The method according to claim 1, wherein the treatment to lower the total partial pressure of oxygen and water vapor to a level not higher than said prescribed value comprises processing an inner wall of said process chamber with a plasma.

5. The method according to claim 1, wherein the treatment to lower the total partial pressure of oxygen and water vapor to a level not higher than said prescribed value comprises covering an inner wall of said process chamber with a silicon nitride film.

6. The method according to claim 5, wherein said silicon nitride film has a thickness not smaller than 15 nm.

7. The method according to claim 1, wherein the reduction of said copper wiring is performed with an ammonia gas plasma.

8. The method according to claim 7, wherein a silane gas is introduced into said ammonia gas plasma after reduction of the copper wiring so as to form a silicon nitride film derived from said ammonia and silane as said second insulating layer.

9. A method of manufacturing a semiconductor device comprising:

providing a semiconductor substrate comprising a buried metal wiring;

estimating a state of oxidation on a surface of said metal wiring by taking into account an amount of sulfur components attached to the surface of said metal wiring;

determining the conditions of a reducing treatment applied to the surface of said metal wiring based on the estimated state of oxidation, wherein the conditions include a time for said reducing treatment determined by taking into account the amount of sulfur components attached to the surface of said metal wiring;

applying a reducing treatment to the surface of said metal wiring under the so determined conditions for the reducing treatment; and forming an insulating layer to cover said reduced metal wiring.

10. The method according to claim 9, wherein the state of oxidation on the surface of said metal wiring is estimated based on at least a time during which said semiconductor substrate is left to stand, from formation of said metal wiring to initiation of said reducing treatment.

11. The method according to claim 9, wherein said metal wiring is subjected to a prescribed surface treatment after formation of said metal wiring.

12. The method according to claim 11, wherein the state of oxidation on the surface of said metal wiring is estimated based on at least a time during which said semiconductor substrate is left to stand, from formation of said metal wiring to initiation of said reducing treatment, and on said surface treatment to which said metal wiring has been subjected.

13. The method according to claim 9, wherein said reducing treatment lowers the oxygen concentration at the interface between said metal wiring and said insulating layer to a level not higher than $1 \times 10^{21}/cm^3$.

14. The method according to claim 9, wherein said reducing treatment includes a plasma processing.

15. The method according to claim 14, wherein a raw material gas of said insulating layer is introduced into said plasma, after said reducing treatment, so as to form said insulating layer.

16. The method according to claim 15, wherein said plasma is an ammonia plasma and said raw material gas is a silane gas.

17. The method according to claim 9, wherein said semiconductor substrate is stored, after formation of said metal wiring, in an ion box equipped with a filter for removing sulfur ions, and, then said semiconductor substrate is taken out of said ion box, and said reducing treatment is conducted on said semiconductor substrate taken out of said ion box.

* * * * *